United States Patent
Inui

[19]
[11] Patent Number: 5,999,720
[45] Date of Patent: Dec. 7, 1999

[54] POST EXPOSURE BAKE SIMULATION METHOD

[75] Inventor: Hirotomo Inui, Tokyo, Japan

[73] Assignee: NEC Corporation, Tokyo, Japan

[21] Appl. No.: 09/019,692

[22] Filed: Feb. 6, 1998

[30] Foreign Application Priority Data

Feb. 6, 1997 [JP] Japan ................................. 9-023836

[51] Int. Cl.⁶ .................................................. G06F 9/455
[52] U.S. Cl. ......................................................... 395/500.34
[58] Field of Search ........................... 395/500.43, 500.34

[56] References Cited

U.S. PATENT DOCUMENTS

| | | | |
|---|---|---|---|
| 5,621,652 | 4/1997 | Eakin | 395/500.06 |
| 5,717,612 | 2/1998 | Capodieci et al. | 395/500.22 |
| 5,845,105 | 12/1998 | Kunikiyo et al. | 395/500.27 |
| 5,876,900 | 3/1999 | Watanaba et al. | 430/288.1 |
| 5,889,678 | 3/1999 | Inouse et al. | 395/500.2 |

FOREIGN PATENT DOCUMENTS

| | | |
|---|---|---|
| 1-209723 | 8/1989 | Japan . |
| 1-300253 | 12/1989 | Japan . |
| 3-216658 | 9/1991 | Japan . |
| 3-237710 | 10/1991 | Japan . |
| 6-342746 | 12/1994 | Japan . |

OTHER PUBLICATIONS

Crank, "Methods of solution when the diffusion coefficient is constant" *Clarendon Press* pp. 11–13 (1975).

Primary Examiner—Kevin J. Teska
Assistant Examiner—Ayni Mohamed
Attorney, Agent, or Firm—Foley & Lardner

[57] ABSTRACT

Disclosed is a post exposure bake simulation method in lithography process to be used for a semiconductor fabrication unit, which has the steps of: expanding an inhibitor concentration distribution to be obtained by exposure calculation according to the boundary condition in the traverse direction; expanding the inhibitor concentration distribution in the depth direction while considering the interface reaction; calculating a Fourier-transformed inhibitor concentration distribution by fast-Fourier-transforming the expanded inhibitor concentration distribution; calculating the Fourier-transform product of the Fourier-transformed inhibitor concentration distribution and the Fourier transform of gaussian distribution; and calculating an inhibitor concentration distribution after diffusion in baking process by inverse-Fourier-transforming the Fourier-transform product by fast-Fourier-transforming.

4 Claims, 4 Drawing Sheets

POST EXPOSURE BAKE SIMULATION METHOD

FIELD OF THE INVENTION

This invention relates to a post exposure bake simulation method in lithography process to be used for a semiconductor fabrication unit.

BACKGROUND OF THE INVENTION

For example, a conventional calculation for inhibitor diffusion in post exposure bake resist is disclosed in J. Crank. "The Mathematics of Diffusion", Clarendon Press, pp. 11–13 (1975).

When inhibitor diffusion in baking is isotropic and the diffusion coefficient is not dependent on concentration and diffusion time, the inhibitor concentration distribution m after time t is given by:

$$m = \{m_0/(4\pi Dt)^{3/2}\}\exp\{-(x^2+y^2+z^2)/4Dt\} \quad (1)$$

where D is the diffusion coefficient and $m_0$ is an initial inhibitor concentration.

When the initial inhibitor concentration distribution $m_c$ (x,y,z) before baking is given by expression (1), the concentration distribution (x,y,z) after the inhibitor diffusion due to baking for time t is given by:

$$m(x,y,z) = m_0(x',y',z')g(x-x',y-y',z-z')dx'dy'dz' \quad (2)$$

where g is gaussian distribution, which is given by:

$$g(x,y,z) = [1/\{2\pi(2\pi)^{1/2}\sigma^3\}]\exp\{-(x^2+y^2+z^2)/2\sigma^2\} \quad (3)$$

where $\sigma$ is diffusion length and is given by $\sigma=(2Dt)^{1/2}$.

The integration of expression (2) is calculated in the range of three times ($3\sigma$) the diffusion length.

However, in the conventional post exposure bake simulation method, there is a problem that, when the diffusion length is elongated, the calculation time becomes long as the number of integration points is increased.

SUMMARY OF THE INVENTION accordingly, it is an object of the invention to provided a post exposure bake simulation method by which the post exposure bake simulation can be fast calculated.

According to the invention, a post exposure bake simulation method in lithography process to be used for a semiconductor fabrication unit, comprises the steps of:

expanding an inhibitor concentration distribution to be obtained by exposure calculation according to the boundary condition in the traverse direction;

expanding the inhibitor concentration distribution in the depth direction while considering the interface reaction;

calculating a Fourier-transformed inhibitor concentration distribution by fast-Fourier-transforming the expanded inhibitor concentration distribution;

calculating the Fourier-transform product of the Fourier-transformed inhibitor concentration distribution and the Fourier transform of gaussian distribution; and calculating an inhibitor concentration distribution after diffusion in baking process by inverse-Fourier-transforming the Fourier-transform product by fast-Fourier-transforming.

According to another aspect of the invention, a post exposure bake simulation method in lithography process to be used for a semiconductor fabrication unit, comprises the steps of:

expanding an inhibitor concentration distribution by a range of 3 $\sigma$ considering the boundary condition in the transverse direction to a diffusion length of $\sigma$ in post-baking;

expanding the inhibitor concentration distribution by a range of 3 $\sigma$ while considering the interface reaction in the depth direction;

Fourier-transforming the expanded inhibitor concentration distribution by using fast Fourier transform;

calculating the product of the Fourier transform of gaussian distribution to be determined from the diffusion length $\sigma$ and the Fourier-transformed inhibitor concentration distribution; and inverse-Fourier-transforming the product by using fast Fourier transform to obtain inhibitor concentration distribution after post-baking.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a post exposure bake simulation method in the preferred embodiments, the aforementioned conventional post exposure bake simulation method will be explained in FIG. 1.

Figure 1:
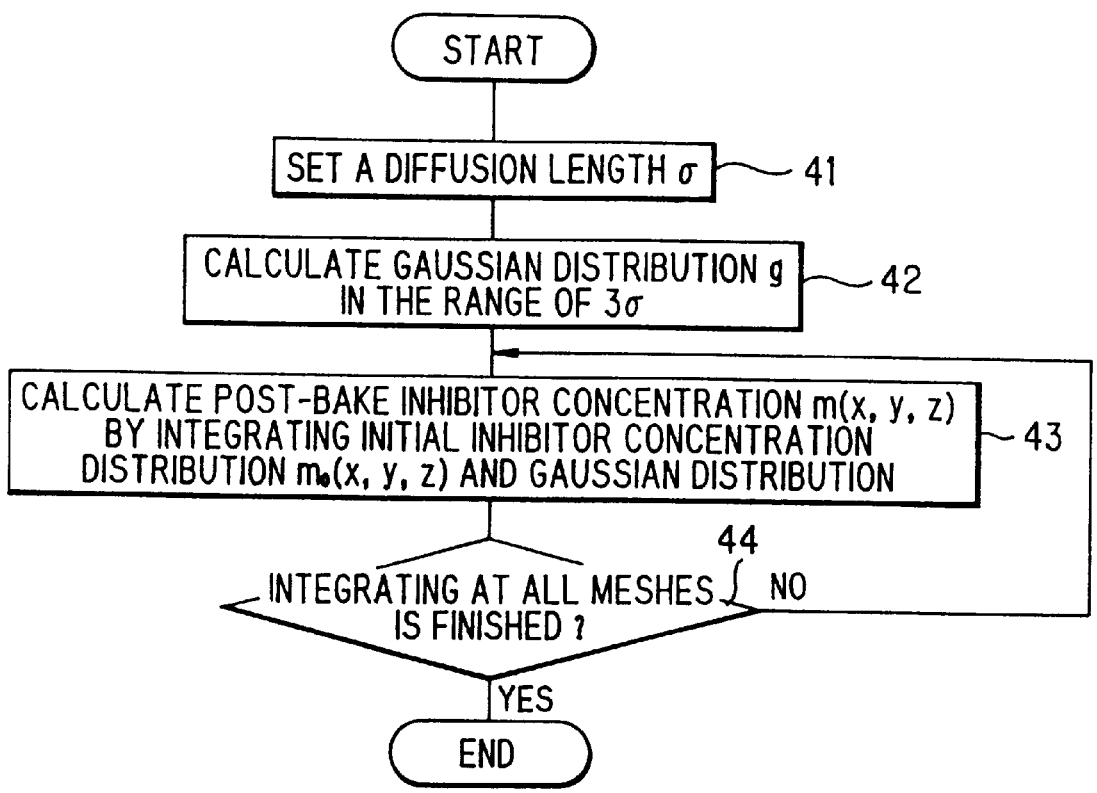
FIG. 1 is a flow chart showing a conventional post exposure bake simulation method.

Referring to FIG. 1, the conventional post exposure bake simulation method will be explained. A diffusion length $\sigma$ is set (Step 41). Then, the gaussian distribution of expression (3) is calculated in the range of 3 $\sigma$ (Step 42). Then, an inhibitor concentration m at position (x,y,z) on resist which is divided into meshes is calculated by expression (2) (Step 43). Step 43 is repeated for all the meshes (Step 44).

Next, a post exposure bake simulation method in the preferred embodiment will be explained below.

Parametric analysis for the calculation of optical intensity in this invention comprises the steps of:

[1] The inhibitor concentration distribution is expanded by a range of 3 $\sigma$ considering the boundary condition in the transverse direction to the diffusion length $\sigma$ in post-baking;

[2] The inhibitor concentration distribution is expanded by a range of 3 $\sigma$ considering the interface reaction in the depth direction;

[3] The expanded inhibitor concentration distribution is Fourier-transformed by using fast Fourier transform (FFT);

[4] The product of the Fourier transform of gaussian distribution to be determined from the diffusion length σ and the Fourier-transformed inhibitor concentration distribution is calculated;

[5] The product is inverse-Fourier-transformed by FFT to obtain inhibitor concentration distribution after post-baking.

When m, g are periodic functions where a resist analysis region is one period, expression (2) can be, according to the property of Fourier transform, transformed into:

$$m = INVFT(FT(m_0) \times FT(g)) \qquad (4)$$

where FT and INVFT are Fourier transform and inverse Fourier transform, respectively.

For g of expression (3), according to the property of gaussian distribution, the contrition from a region outside the 3 σ range from the origin (0,0,0) can be almost neglected. Also, the diffusion length σ can be dealt with as a periodic function as it is sufficiently smaller than resist analysis region.

As to the transverse direction of $m_0$, it is a Neumann boundary where no mass transfer at interface occurs when it is not a periodic function. Therefore, the next equations can be given.

$$\partial M/\partial x = 0, \ \partial M/\partial y = 0 \qquad (5)$$

This boundary condition can be satisfied by giving a reflection boundary where data are expanded by 3 σ by reflecting them on the boundary. The expanded function can be dealt with as a periodic function.

$m_0$ which is expanded by the above process can be calculated by Fourier transform in expression (4). Therefore, the calculation time can be reduced by using the algorithm of FFT.

Figure 2:
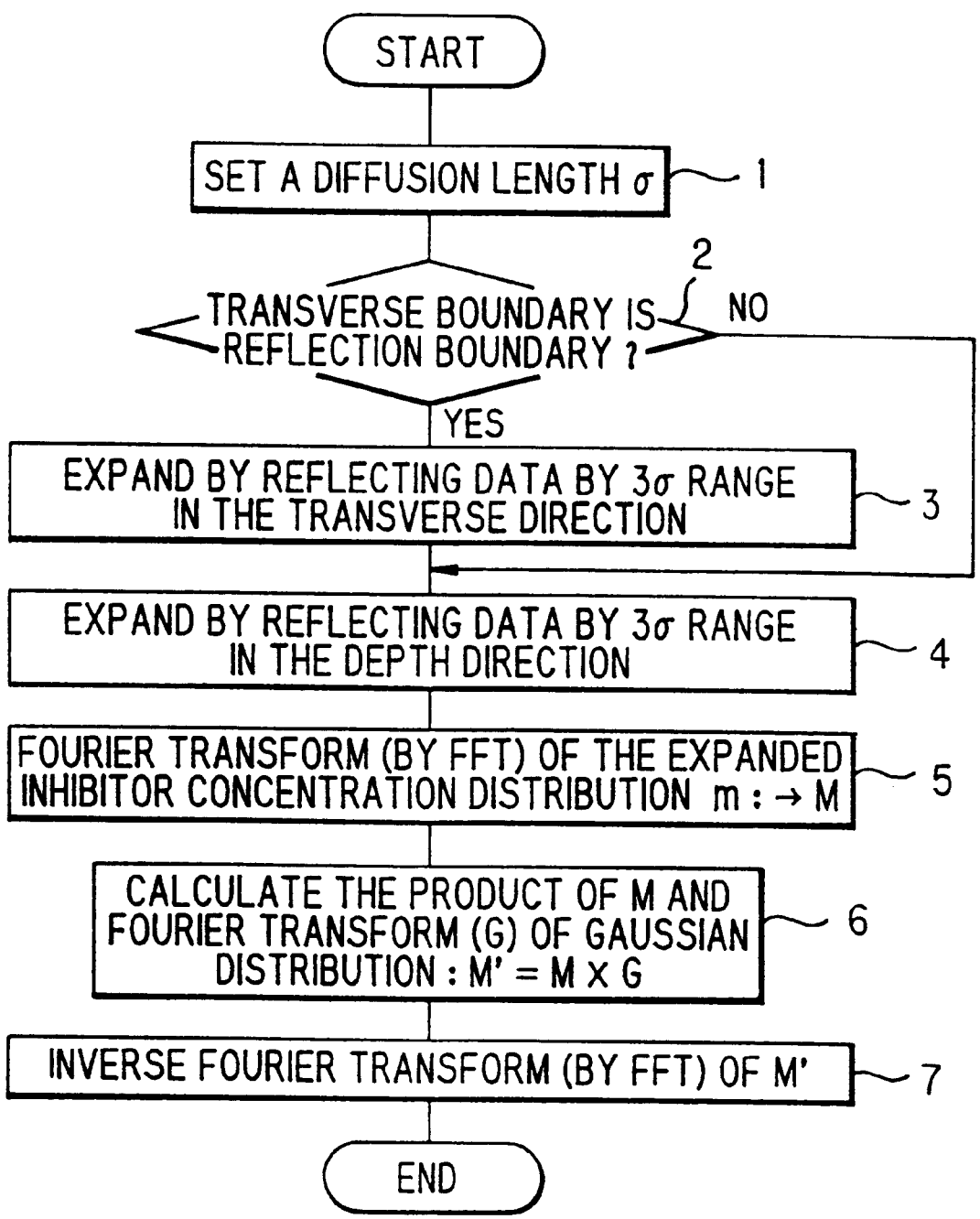
FIG. 2 is a flow chart showing a post exposure bake simulation method in a first preferred embodiment according to the invention.

A post exposure bake simulation method in the first preferred embodiment will be explained with reference to the flow chart in FIG. 2.

A diffusion length σ is set (Step 1).

When the boundary condition of the initial inhibitor concentration distribution $m_0$ in the traverse direction is a reflection boundary, data are expanded by the 3 σ range by reflecting them from the boundary in the transverse direction (Steps 2, 3)

Then, data are expanded by the 3 σ range by reflecting them from the boundary in the depth direction (Z) of $m_0$ (Step 4).

Then, the expanded inhibitor concentration distribution m is Fourier-transformed by using fast Fourier transform (FFT) (Step 5).

Then, the product M'=M×G of the Fourier transform G of gaussian distribution and the Fourier-transformed inhibitor concentration distribution M is calculated (Step 6).

The product M' is inverse-Fourier-transformed by FFT (Step 7).

Figure 3:
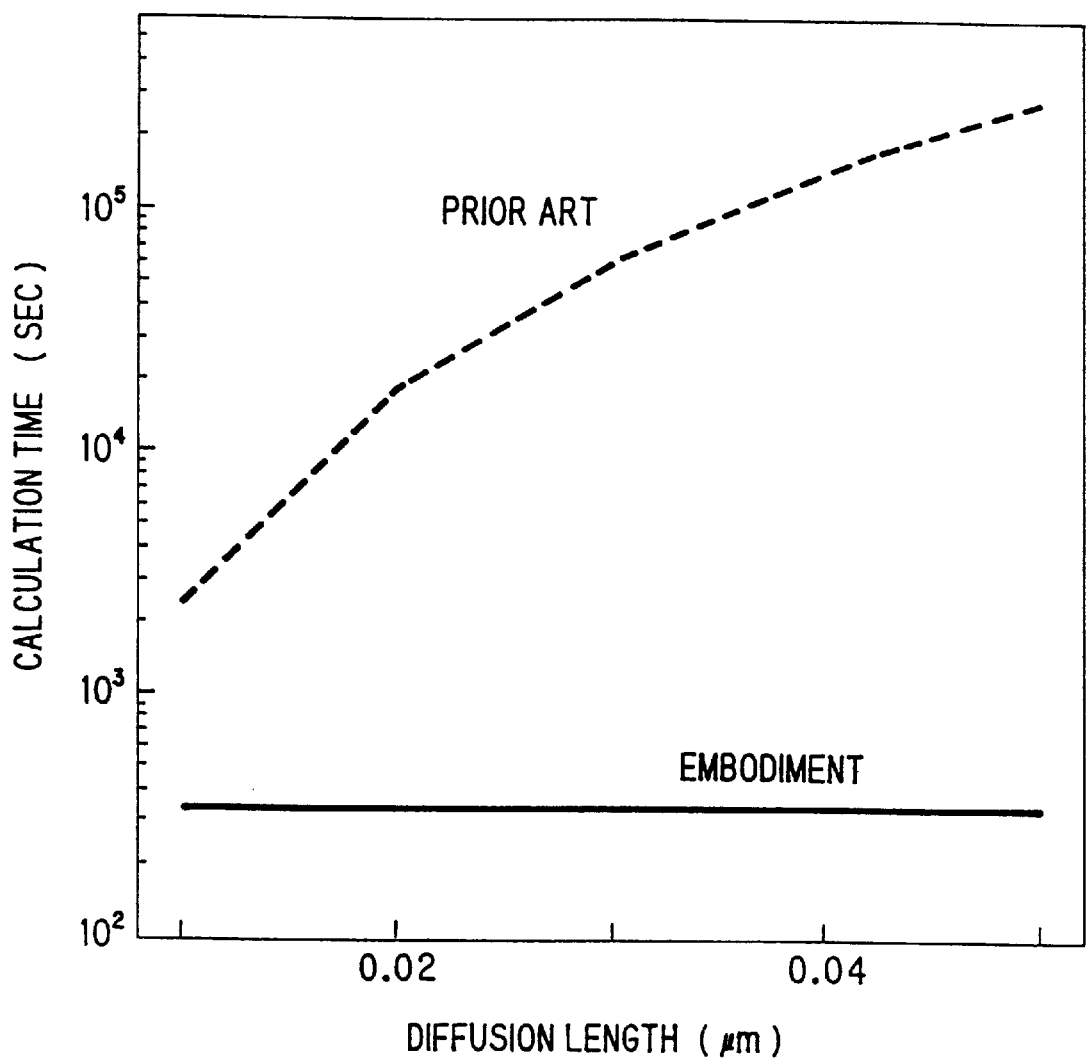
FIG. 3 is a graph showing a characteristic of calculation time to diffusion lengths in the first embodiment.

FIG. 3 shows a characteristic of calculation time to diffusion lengths in the case that three-dimensional post exposure bake simulation in the embodiment of the invention with a pitch pattern of 0.70 μm is conducted. In prior art, the calculation time is increased with an increase in integral points caused by elongation of diffusion length. On the contrary, in this embodiment, the calculation time is kept to be constant to diffusion lengths. Therefore, the calculation time can be significantly shortened.

Figure 4:
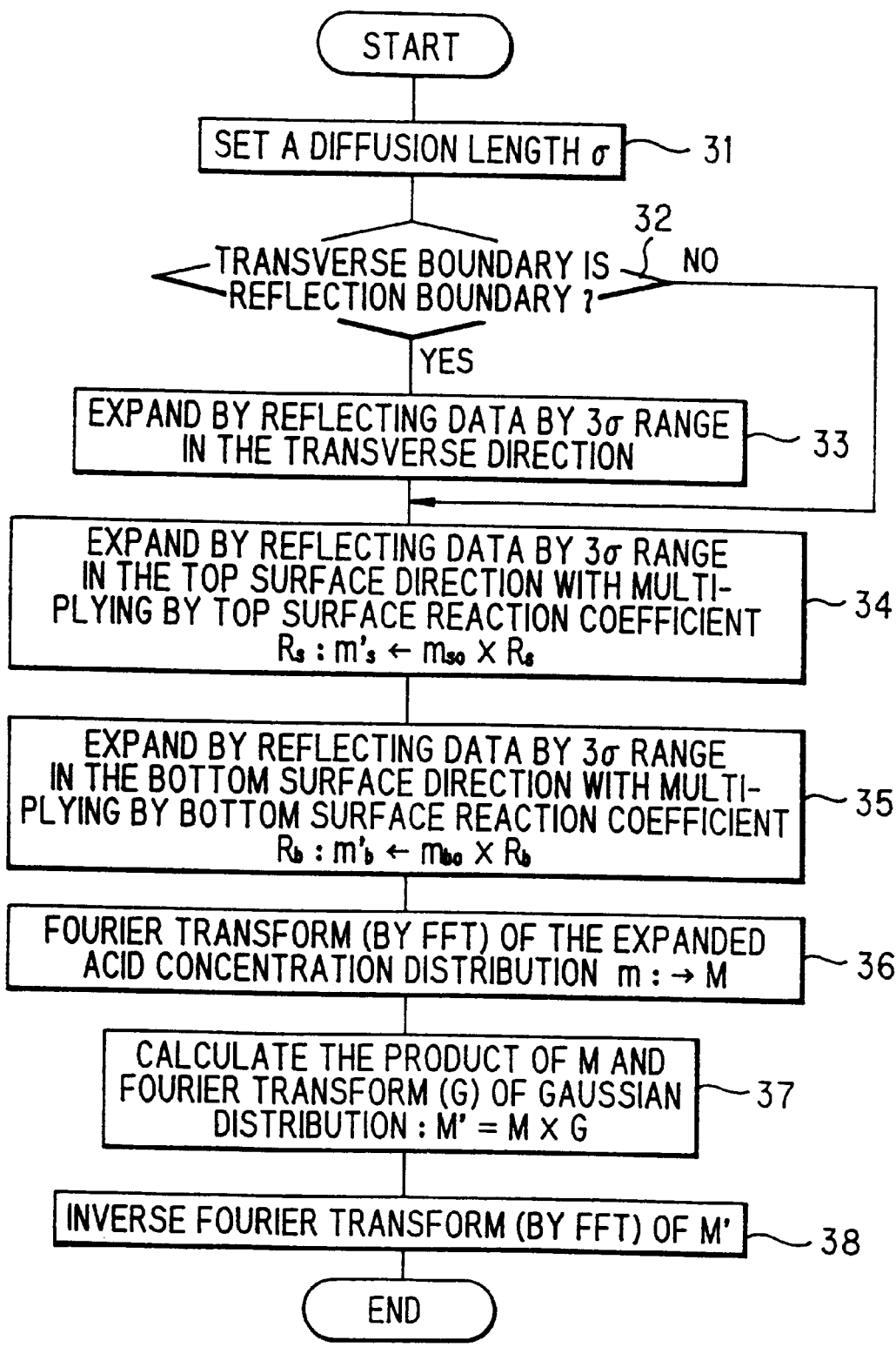
FIG. 4 is a flow chart showing a post exposure bake simulation method in a second preferred embodiment according to the invention.

A post exposure bake simulation method in the second preferred embodiment will be explained with reference to the flow chart in FIG. 4. The second embodiment is basically like the first embodiment in FIG. 2. Therefore, only different points will be explained.

In the second embodiment, the interface reaction of acid in chemically amplified resist is calculated making a correction when expanding data in the depth direction. Namely, the expanded periodic function m is given by multiplying data reflected on the boundary by a top surface reaction coefficient Rs or a bottom surface reaction coefficient Rb, which represent the rates that initial acid concentration distribution $m_0$ is lost near the top surface and the bottom surface, respectively (Steps 34, 35).

Thus, in the second embodiment, the acid reaction near the interface of the chemically amplified resist is calculated by FFT while incorporating the boundary correction. Therefore, the calculation time can be much shorter than that of prior art.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A post exposure bake simulation method in lithography process to be used for a semiconductor fabrication unit, comprising the steps of:

expanding an inhibitor concentration distribution to be obtained by exposure calculation according to the boundary condition in the traverse direction;

expanding said inhibitor concentration distribution in the depth direction while considering the interface reaction;

calculating a Fourier-transformed inhibitor concentration distribution by fast-Fourier-transforming said expanded inhibitor concentration distribution;

calculating the Fourier-transform product of said Fourier-transformed inhibitor concentration distribution and the Fourier transform of gaussian distribution; and calculating an inhibitor concentration distribution after diffusion in baking process by inverse-Fourier-transforming said Fourier-transform product by using the algorithm of fast Fourier transform.

2. A post exposure bake simulation method, according to claim 1, wherein:

said step of expanding said inhibitor concentration distribution in the depth direction while considering the interface reaction includes the step of multiplying data reflected on the boundary by the rates that initial acid concentration distribution in chemically amplified resist is lost near the top surface and the bottom surface, respectively.

3. A post exposure bake simulation method in lithography process to be used for a semiconductor fabrication unit, comparing the steps of:

expanding an inhibitor concentration distribution by a range of 3 σ considering the boundary condition in the transverse direction to a diffusion length of σ in post exposure baking;

expanding said inhibitor concentration distribution by a range of 3 σ while considering the interface reaction in the depth direction;

Fourier-transforming the expanded inhibitor concentration distribution by using the algorithm of fast Fourier transform;

calculating the product of the Fourier transform of gaussian distribution to be determined from the diffusion length σ and the Fourier-transformed inhibitor concentration distribution; and inverse-Fourier-transforming said product by using the algorithm of fast Fourier transform to obtain inhibitor concentration distribution after post exposure baking.

4. A post exposure bake simulation method, according to claim 3, wherein:

said step of expanding said inhibitor concentration distribution by a range of 3 σ while considering the interface reaction in the depth direction includes the step of multiplying data reflected on the boundary by the rates that initial acid concentration distribution in chemically amplified resist is lost near the top surface and the bottom surface, respectively.

* * * * *